United States Patent
Ottens et al.

(10) Patent No.: US 7,119,885 B2
(45) Date of Patent: Oct. 10, 2006

(54) LITHOGRAPHIC APPARATUS AND DEVICE MANUFACTURING METHOD

(75) Inventors: Joost Jeroen Ottens, Veldhoven (NL); Tjarko Adriaan Rudolf Van Empel, Eindhoven (NL); Aschwin Lodewijk Hendricus Johannes Van Meer, Roosendaal (NL); Jan Rein Miedema, Eindhoven (NL); Koen Jacobus Johannes Maria Zaal, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/926,402

(22) Filed: Aug. 26, 2004

(65) Prior Publication Data

US 2005/0117141 A1 Jun. 2, 2005

(51) Int. Cl.
*G03B 27/62* (2006.01)
*G03B 27/58* (2006.01)

(52) U.S. Cl. .......................... 355/75; 355/72
(58) Field of Classification Search .............. 355/72, 355/75
See application file for complete search history.

(56) References Cited

U.S. PATENT DOCUMENTS 4,551,192 A * 11/1985 Di Milia et al. ........ 156/345.51
5,374,829 A 12/1994 Sakamoto et al.
5,530,616 A * 6/1996 Kitabayashi et al. ........ 361/234
5,583,736 A * 12/1996 Anderson et al. ........... 361/234
5,825,607 A * 10/1998 Burkhart .................... 361/234
5,923,408 A 7/1999 Takabayashi
6,030,282 A * 2/2000 Mahanpour ................ 451/364
6,183,189 B1 2/2001 Lzu et al.
6,809,802 B1 * 10/2004 Tsukamoto et al. ........... 355/72
2002/0008864 A1 1/2002 Kondo
2005/0152088 A1 * 7/2005 Ito et al. .................... 361/233

FOREIGN PATENT DOCUMENTS

| EP | 0 947 884 A2 | 10/1999 |
| EP | 0 947 884 A3 | 7/2001 |
| EP | 1 378 936 A2 | 1/2004 |
| JP | 8-181054 | 7/1996 |

* cited by examiner

*Primary Examiner*—W. B. Perkey
*Assistant Examiner*—Vivian Nelson
(74) *Attorney, Agent, or Firm*—Pillsbury Winthrop Shaw Pittman LLP

(57) ABSTRACT

A lithographic apparatus is disclosed. The apparatus includes an illumination system for conditioning a beam of radiation, and an article support for supporting a substantially flat article to be placed in the beam of radiation. The article support includes a plurality of supporting protrusions for supporting the article, and at least one protective member located near a boundary of the supporting protrusions for protecting at least a boundary portion of the supporting protrusions during release of the article. The apparatus also includes a releasing device for releasing said article from said article support.

20 Claims, 4 Drawing Sheets

LITHOGRAPHIC APPARATUS AND DEVICE MANUFACTURING METHOD

CROSS-REFERENCE TO RELATED APPLICATIONS

This application claims the benefit of priority from European Patent Application No. 03077703.1, filed Aug. 29, 2003, the entire content of which is incorporated herein by reference.

FIELD

The present invention relates to a lithographic apparatus and a device manufacturing method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. including part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

In the conventional lithographic projection apparatus, during photolithographic processes, an article, such as a wafer or reticle, is clamped on an article support by a clamping force that may range from vacuum pressure forces, electrostatic forces, intermolecular binding forces or just the gravitational force. The article support defines a plane in the form of a plurality of protrusions defining an even flat surface on which the wafer or reticle is held. Tiny variations in the height of these protrusions are detrimental to image resolution, since a small deflection of the article from an ideal plane orientation may result in rotation of the wafer and a resulting overlay error due to this rotation. In addition, such height variations of the article support may result in height variation of the article that is supported thereby. During the lithographic process, such height variations may affect image resolution due to a limited focal distance of the projection system. Therefore, it is desirable to have an ideal flat article support.

European patent application EP0947884 describes a lithographic apparatus having a substrate holder in which protrusions are arranged to improve the flatness of the substrate. These protrusions have a general diameter of 0.5 mm and are located generally at a distance of 3 mm away from each other, thereby forming a bed of supporting members that support the substrate. Due to the relative large spaces in between the protrusions, any contamination that is present generally does not form an obstruction for the flatness of the substrate, since the contamination will be lying in between the protrusions and will not lift the substrate locally.

In the context of this application, the "article" may be any of the above-mentioned terms wafer, reticle, mask, or substrate, more specifically terms such as a substrate to be processed in manufacturing devices employing lithographic projection techniques; or a lithographic projection mask or mask blank in a lithographic projection apparatus, a mask handling apparatus such as mask inspection or cleaning apparatus, or a mask manufacturing apparatus or any other article or optical element that is clamped in the light path of the radiation system.

It has come to the attention of the inventors that this clamping force may cause problems when the article is released from the article support.

A common way to release the article from the article support is by stepping up a release force exerted by an ejection pin mechanism (e-pins), which engages at the article and provides a releasing force to disengage the article from the article support. The energy that is built up in the article during this stepping up is converted into displacement by subsequent release of the article surface from the article support surface. However, this built up energy may also cause damage to the article or article support. In general, by releasing the article from the article support, an uneven load distribution of the protrusions is obtained. In particular, the protrusions near a boundary are very much unevenly loaded and by slight rotations of the article and slip between the article and the supporting protrusions, the protrusions may wear and the article support will eventually loose its perfectly level plane of support due to tiny variations of the height and form of protrusions that are introduced during this release action.

SUMMARY

It is an aspect of the present invention to overcome this problem by providing a photolithographic machine in which the release energy, when the article is finally released from the wafer holder, is not detrimental for the article support, in particular, for the supporting protrusions defining the plane of support.

It is an aspect of the present invention to provide a lithographic apparatus that includes an illumination system for providing a beam of radiation, and an article support for supporting a substantially flat article to be placed in the beam of radiation. The article support includes a plurality of supporting protrusions for supporting the article. The article support also includes at least one protective member located near a boundary of the supporting protrusions for protecting at least a boundary portion of the supporting protrusions during release of the article. The apparatus also includes a releasing device for releasing the article from the article support. In this way, the energy is absorbed by a zone of the wafer holder where flatness is not crucial. Hence, in the photolithographic process, flatness can be maintained for the protrusions defining the plane of support.

In an embodiment, the protective member is formed by a boundary portion of supporting protrusions having a supporting area that is larger than a supporting area of a supporting protrusion away from the boundary. Since the supporting area is larger, a small wear of this area near the boundary thereof has relative little effect and will not affect the supporting area as much as a protrusions having a "standard" supporting area.

Preferably, the supporting area of the plurality of protrusions, viewed in a direction away from the boundary, gradually decreases with a distance of the protrusions to the boundary. In this way, since increasing the area of support is a trade off for the requirement of an even load distribution on the protrusions, the load distribution is made more continuous towards the protrusions away from the boundary.

Furthermore, the supporting area may range from 2–50 times a supporting area of a supporting protrusion away from the boundary.

In a relatively easily manufacturable embodiment, a plurality of the supporting protrusions each include a base cylinder of a first diameter and a supporting top cylinder of a second diameter smaller or equal to the first diameter, wherein the top cylinders of the protrusions forming a protective member are larger in diameter than the top cylinders of protrusions away from the boundary.

Preferably, the protective member defines a first gap between the plane of support and the protective member, so that the protective member contacts the article only during release thereof. This gap may range in a range of 0.5–2.5 μm, preferably 1 μm. This gives as a considerable benefit, that the load distribution is not affected by the presence of the protective member, wherein furthermore during release, on the slightest tilt of the article during release, the protective member is contacted so that the supporting area of the protrusion is kept intact. In order to provide a well designed protective member that does not affect the normal supporting condition of the article support, preferably, the protective member extends away from the boundary, more preferably, the protective member has a strip form extending away from the boundary. In one embodiment, a plurality of the supporting protrusions each include a base cylinder of a first diameter and a supporting top cylinder of a second diameter that is smaller than the first diameter, wherein the top cylinders has a length equal to the first gap, so that the protective member is formed by the base cylinder of the protrusion.

In addition, the article support may include a boundary wall adjacent to the plurality of supporting protrusions, the boundary wall providing a second gap between the plane of support and the wall for providing a leaking seal, the second gap being larger than the first gap. Such a so-called "leaking" seal configuration is described in the above referenced European patent application. The protective member may traverse the boundary wall. Specifically, since the protective member may traverse the wall only on selected places, for example, every third to tenth protrusion along the boundary, such a traversal does not affect the leaking seal properties in an adverse manner.

It is an aspect of the present invention to provide a device manufacturing method. A device manufacturing method includes conditioning a beam of radiation, and supporting a patterning device with an article support. The patterning device is configured to pattern the beam of radiation. The article support includes a plurality of supporting protrusions. The method also includes projecting the patterned beam of radiation onto a substrate, and releasing the patterning device from the article support with a releasing device, and protecting at least a boundary portion of the plurality of supporting protrusions during the release of the patterning device.

It is an aspect of the present invention to provide a device manufacturing method. The method includes conditioning a beam of radiation, patterning the beam of radiation with a patterning device, and supporting a substrate with an article support. The article support includes a plurality of supporting protrusions. The method also includes projecting the patterned beam of radiation onto a target portion of the substrate, releasing the substrate from the article support with a releasing device, and protecting at least a boundary portion of the plurality of supporting protrusions during the release of the substrate.

It is an aspect of the present invention to provide an article support for supporting an article in a lithographic apparatus. The article support includes a plurality of supporting protrusions, including first protrusions for supporting a peripheral region of the article and second protrusions for supporting other regions of the article. The first protrusions and the second protrusions have associated support surfaces for engaging the article. An area of the support surfaces of at least some of the first protrusions is greater than an area of at least some of the support surfaces of the second protrusions.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example, a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example, in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" used herein should be broadly interpreted as referring to a device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable as required and which may ensure that the patterning device is at a desired position, for example, with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example, for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
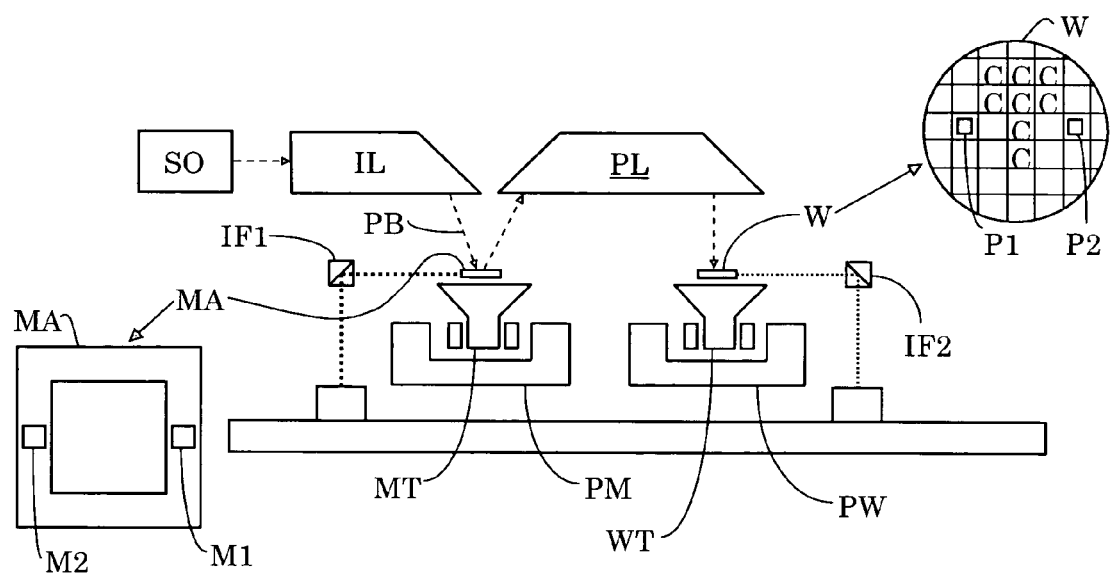
FIG. 1 depicts a lithographic apparatus according to an embodiment of the invention.

FIG. 1 schematically depicts a lithographic apparatus according to a particular embodiment of the invention. The apparatus includes: an illumination system (illuminator) IL for providing a projection beam PB of radiation (e.g. UV or EUV radiation); a first article support or support structure (e.g. a mask table) MT for supporting a patterning device (e.g. a mask) MA and connected to a first positioning device PM for accurately positioning the patterning device with respect to item PL; a second article support or substrate table (e.g. a wafer table) WT for holding a substrate (e.g. a resist-coated wafer) W and connected to a second positioning device PW for accurately positioning the substrate with respect to item PL; and a projection system (e.g. a reflective projection lens) PL for imaging a pattern imparted to the projection beam PB by the patterning device MA onto a target portion C (e.g. including one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives a beam of radiation from a radiation source SO. The source and the lithographic apparatus may be separate entities, for example, when the source is a plasma discharge source. In such cases, the source is not considered to form part of the lithographic apparatus and the radiation beam is generally passed from the source SO to the illuminator IL with the aid of a radiation collector including for example, suitable collecting mirrors and/or a spectral purity filter. In other cases the source may be integral part of the apparatus, for example, when the source is a mercury lamp. The source SO and the illuminator IL, may be referred to as a radiation system.

The illuminator IL may include an adjusting device for adjusting the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the projection beam PB, having a desired uniformity and intensity distribution in its cross-section.

The projection beam PB is incident on the mask MA, which is held on the mask table MT. Being reflected by the mask MA, the projection beam PB passes through the lens PL, which focuses the beam onto a target portion C of the substrate W. With the aid of the second positioning device PW and position sensor IF2 (e.g. an interferometric device), the substrate table WT can be moved accurately, e.g. so as to position different target portions C in the path of the beam PB. Similarly, the first positioning device PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Figure 2:
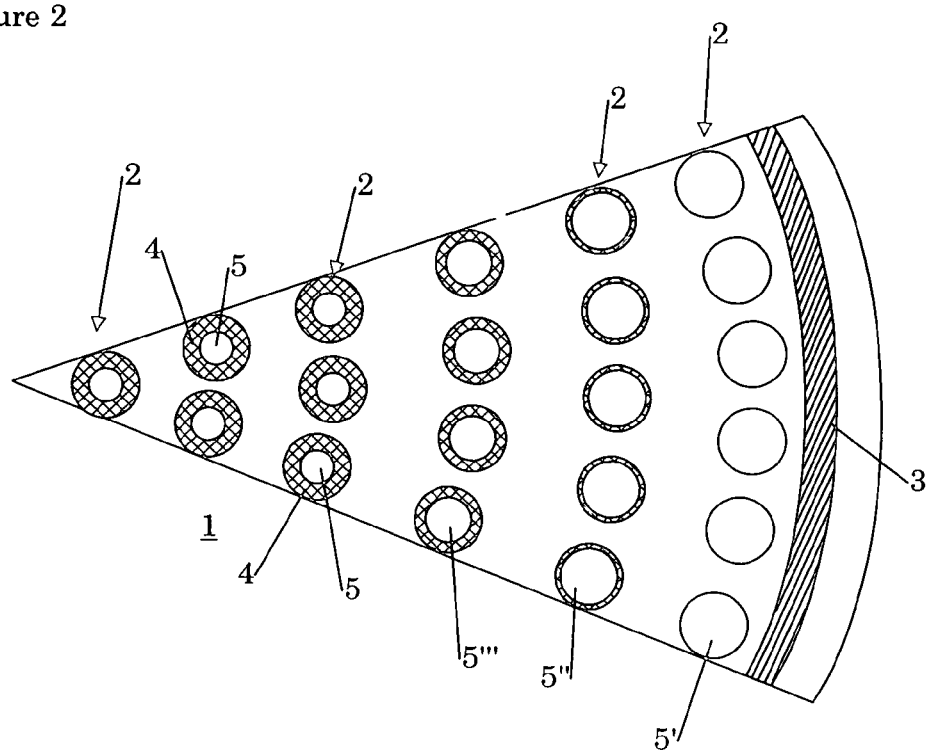
FIG. 2 depicts a schematic plan view of a segment of a first embodiment of an article support according to the invention.

In FIG. 2, a schematic plan view is illustrated of a segment of an article support 1 according to the invention. In the figure, a plurality of protrusions 2 are oriented in substantially concentric circles. To improve the intelligibility, only a few protrusions 2 are referenced in the figures. A surrounding wall 3 is dimensioned to provide a leaking seal as is explained in greater detail in the above-referenced EP0947884. That is, the wall 3 encloses the protrusion configuration and is generally circular in form, and has a uniform height that provides a gap ranging from 1–5 μm, preferably 3 μm between the plane of support and the wall 3 for providing a leaking seal. Such a leaking seal is preferential in a configuration where an article such as a wafer to be illuminated is clamped by vacuum pressure on the article support. By allowing a slight "leak" the vacuum near the boundaries tends to provide a better load to the article, providing better imaging properties due to an improved flatness of the article, being a wafer or a reticle.

The protrusions 2 are formed by a base cylinder 4 of a first diameter and a supporting top cylinder 5 of a second diameter that is smaller or equal to the first diameter. In the figure, as an example, the base cylinder 4 has a diameter of 0.5 mm and the top cylinder 5 has a diameter of 0.15 mm and a length of 3 μm, substantially equal to the gap provided by the leaking seal. The protrusions 2 define a protrusion configuration for providing a plane of support of an article (not shown) to be supported on the article support. Such plane of support is substantially flat, that is, defines a height variation of less than 100 nm, preferably less than 10 nm.

As shown by the embodiment of FIG. 2, the top cylinders 5' of the protrusions 2 near the boundary wall 3 form a protective member, since they are larger in diameter than the top cylinders 5 of protrusions away from the boundary. The protrusions 2 near the boundary wall 3 are thus more robust in form, so that wear during release does not affect the protrusions 2 as it would with protrusions with a lesser diameter that are positioned more towards the center of the article support. In particular, an amount of wear per release of the wafer has a strongly reduced effect on the outer protrusions according the design of the inventive embodiment, since their supporting area is larger than a supporting area of a supporting protrusion away from the boundary wall 3 ranging from 2–50 times, preferably 10 times, a supporting area of a supporting protrusion away from the boundary wall 3.

In the arrangement of FIG. 2, a gradual change in diameter is shown of the protrusions 5' and 5''' more distant from the boundary wall 3, since, viewed in a direction away from boundary wall 3, the supporting area formed by the top cylinders 5', 5'', 5''' of the protrusions 2 gradually decrease with the distance from the boundary wall 3. In a practical embodiment, such a decrease in diameter with distance may be formed by eight rows of consecutive protrusions 2, in which, for example, the first row from the boundary wall 3 has a top cylinder diameter that is equal to the base cylinder diameter, and then, consecutively, the diameter of the top cylinders of subsequent more inner rows decreases from 0.5 to 0.15 mm in steps whereby the surface area per burl decreases linear per row. The embodiment of FIG. 2 is relatively easy to manufacture, since it offers protection from wear, whereas the design includes only two different altitudes, that is, the altitude of the boundary wall 3 and base cylinders 4 at a first altitude and the altitude of the top cylinder 5 at a second altitude, differing preferably about 3 μm from the first altitude.

Figure 3:
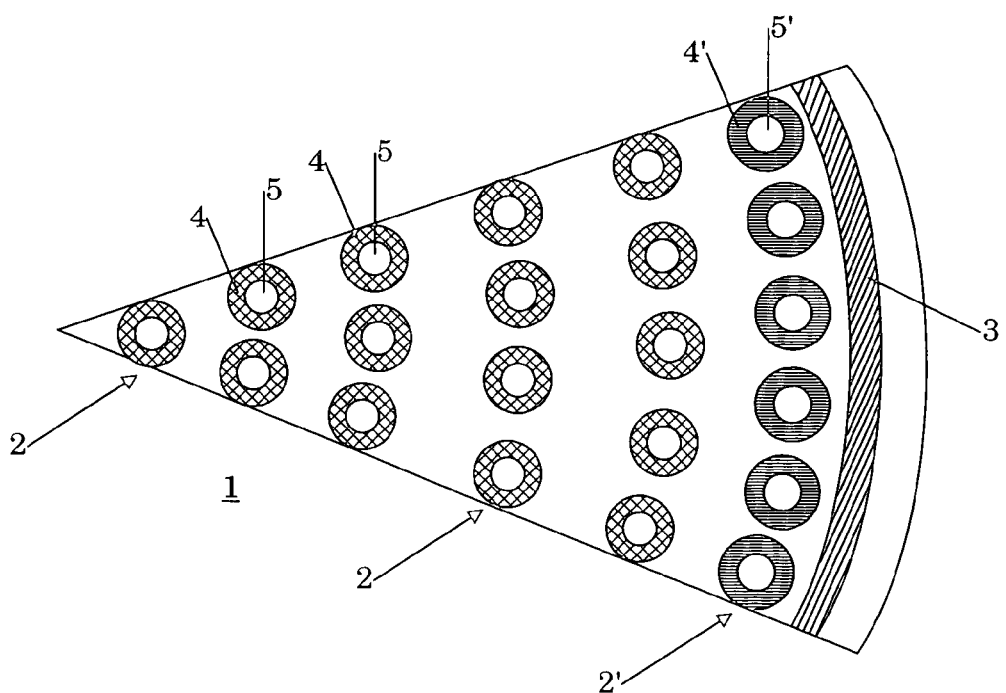
FIG. 3 depicts a schematic plan view of a segment of a second embodiment of an article support according to the invention.

FIG. 3 shows an embodiment in which a further altitude is introduced in between the first and second altitude, as discussed with reference to FIG. 2. Here, the diameters of the base cylinders 4 and top cylinders 5 are kept relatively constant throughout the whole design, but the height of the top cylinders is varied for the protrusions 2' in the direct vicinity of the boundary, also formed by the boundary wall 3 in the embodiment of FIG. 3. Instead of a "normal" height of approximately 3 μm, the base cylinder 4' of the boundary protrusions 2' is lengthened and the top cylinder 5' of the boundary is shortened. The resultant protrusion 2' includes a support area that lies within the plane of support, but with the base cylinder defining only a small gap of approximately 0.5–2.5 μm, preferably 1 μm between the base cylinder 4 and the plane of support. In this way, the base cylinder 4' forms a protective member that contacts the article only during release thereof. The load distribution is therefore not affected by the presence of the protective element formed by the base cylinder 4', and during release, on the slightest tilt of the article during release, the base cylinder 4' is contacted so that the supporting area of top cylinder 5' of the protrusion 2 is kept intact. Such tilt may be expressed in terms of rotation of the article surface, which may amount to maximum values as much as 2–3 mrad.

Figure 4:
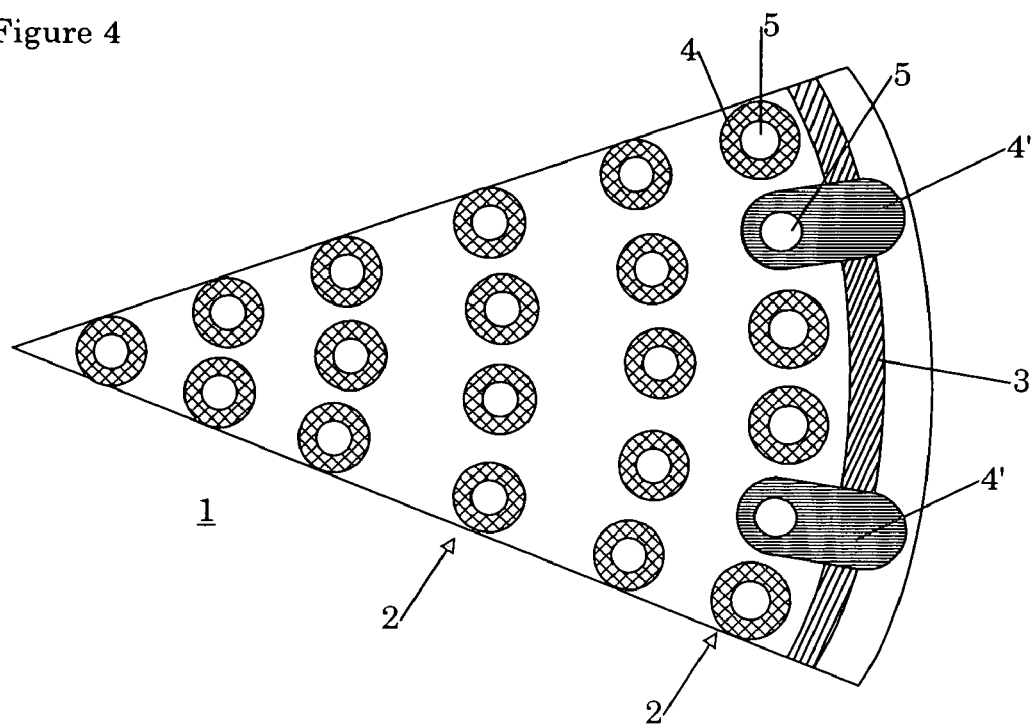
FIG. 4 depicts a schematic plan view of a segment of a third embodiment of an article support according to the invention.

FIG. 4 shows a configuration in which only some of the boundary protrusions are provided with a protective contact zone as explained with reference to FIG. 3. In the figure, every third protrusion has a protective zone 4', that is extended through the wall 3 towards the edge of the article, that extends generally beyond the boundary wall 3 in radial direction. The extended protective zones 4' are formed in a radial strip form that extends well beyond the wall 3, for example, up to a length where the article edge is present in a condition where the article is supported on the article support.

Figure 5:
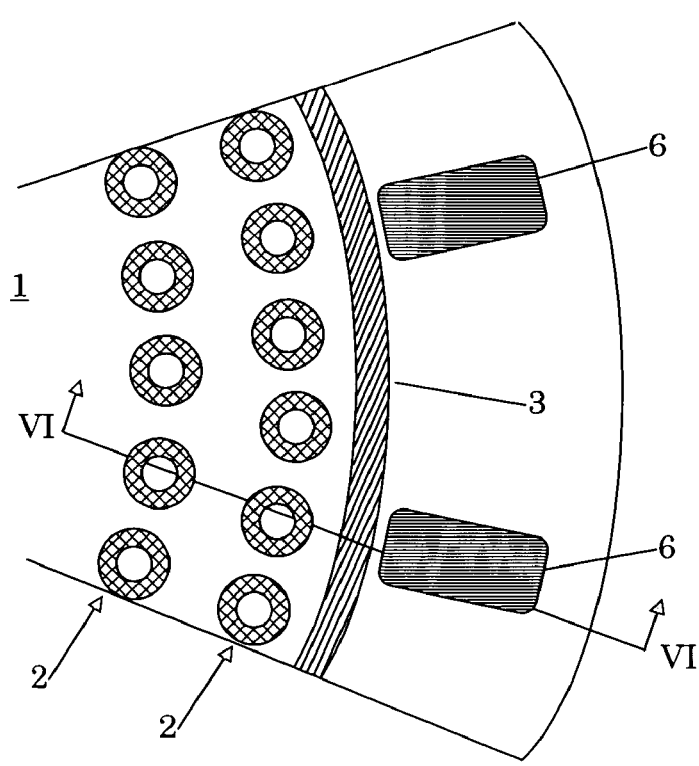
FIG. 5 depicts a schematic plan view of a segment of a fourth embodiment of an article support according to the invention.

FIG. 5 shows another embodiment according to the invention, in which the protective member is formed by a contact zone 6 that is separate from the existent protrusion and wall configuration. This embodiment is more easily manufacturable than the embodiment of FIG. 4. More specifically, the contact zone 6 is formed by an area located at substantially the same altitude as the protective member 4' in FIG. 3 and FIG. 4. That is, this contact zone 6 also provides a small gap of preferably 1 μm between the contact zone 6 and the plane of support, so that the contact zone 6 contacts the article only during release thereof. In FIG. 5, the contact zone 6 is designed in the area outside the surrounding wall 3. In this area, normally, the edge of the article is present, so that upon release, the edge of the article is supported on the contact area 6 without wearing or damaging the protrusions 2 and thus protecting the protrusions 2.

Figure 6:
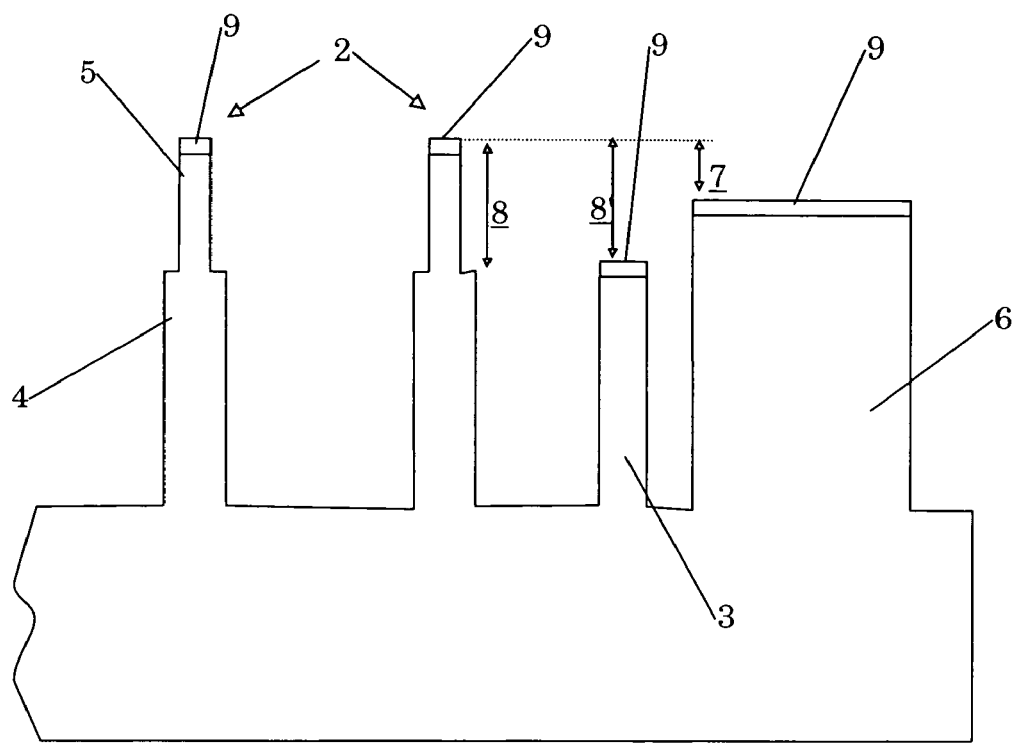
FIG. 6 shows a cross-sectional view of FIG. 5 along the line VI—VI.

In FIG. 6 a cross-sectional view is depicted illustrating a cross section along the line VI—VI in FIG. 5. Here, it becomes apparent how the heigh variations of the protrusions 2, the base-cylinders 4 and the protective members 4' may be arranged according to an embodiment of the invention. While the protective member 4' may define a gap 7 as large as the gap 8 defined by the base-cylinders 4 away from the surrounding wall 3 (typically, 3–5 µm) preferably, this gap 7 is smaller, preferably not larger than 1 µm, so that, upon release, the article immediately contacts the protective member and thereby reducing the wearing force between the article and the top cylinders 5. The gap 8' defined by the surrounding wall is typically in the order of the gap defined by the base-cylinders 4. Furthermore, the article support may be covered with a wear resistant layer 9, for example, a TiN layer in the order of 2 µm, at least preferably larger than 1.7 µm to further protect protruding elements, specifically, the top cylinders 5. Although in this example every protrusion is covered, the layer may be restricted to certain parts, especially, to the parts that are most sensitive to wear such as for example, the top cylinders 5. In this example, the surrounding wall also defines a gap of typically 3–5 µm below the support plane defined by the top edges of cylinders 5.

While specific embodiments of the invention have been described above, it will be appreciated that the invention may be practiced otherwise than as described. The description is not intended to limit the invention.

What is claimed is:

1. A lithographic apparatus comprising:
   an illumination system for conditioning a beam of radiation;
   an article support for supporting a substantially flat article to be placed in said beam of radiation, said article support comprising a plurality of supporting protrusions for supporting the article, a boundary substantially surrounding said supporting protrusions, and at least one protective member located near said boundary for protecting at least a boundary portion of said supporting protrusions during release of said article; and
   a releasing device for releasing said article from said article support.

2. A lithographic apparatus according to claim 1, wherein said protective member is formed by the boundary portion of said supporting protrusions, individual supporting protrusions within said boundary portion having a supporting area that is larger than a supporting area of individual supporting protrusions located away from said boundary.

3. A lithographic apparatus according to claim 2, wherein the supporting area of the supporting protrusions gradually decreases as a distance of said protrusions to said boundary increases.

4. A lithographic apparatus according to claim 2, wherein said supporting area of said supporting protrusions within said boundary portion ranges from 2–50 times said supporting area of said supporting protrusions located away from said boundary.

5. A lithographic apparatus according to claim 2, wherein the plurality of said supporting protrusions individually comprise a base cylinder of a first diameter and a supporting top cylinder of a second diameter smaller or equal to said first diameter, wherein the top cylinders of the protrusions forming the protective member are larger in diameter than the top cylinders of the protrusions away from said boundary.

6. A lithographic apparatus according to claim 1, wherein said protective member defines a first gap between said plane of support and said protective member, so that said protective member contacts said article only during the release of the article.

7. A lithographic apparatus according to claim 6, wherein said protective member extends away from said boundary.

8. A lithographic apparatus according to claim 7, wherein said protective member has a strip form.

9. A lithographic apparatus according to claim 6, wherein the plurality of said supporting protrusions individually comprise a base cylinder of a first diameter and a supporting top cylinder of a second diameter that is smaller than said first diameter, wherein the top cylinder has a length equal to said first gap, so that said protective member is formed by said base cylinder of said protrusion.

10. A lithographic apparatus according to claim 6, wherein said article support comprises a boundary wall adjacent to said plurality of supporting protrusions, said boundary wall providing a second gap between said plane of support and said wall for providing a leaking seal, said second gap being larger than said first gap.

11. A lithographic apparatus according to claim 10, wherein said protective member traverses said boundary wall.

12. A lithographic apparatus according to claim 1, wherein at least a part of said article support is coated with a wear resistant layer.

13. A lithographic apparatus according to claim 12, wherein said wear resistant layer is a TiN coating.

14. A lithographic apparatus according to claim 1, wherein said article support is a support for supporting a patterning device, the patterning device configured to pattern the beam of radiation.

15. A lithographic apparatus according to claims 1, wherein said article support is a substrate table for holding a substrate to be patterned by a patterned beam of radiation.

16. A device manufacturing method comprising:
    conditioning a beam of radiation;
    supporting a patterning device with an article support, said patterning device configured to pattern the beam of radiation, said article support comprising a plurality of supporting protrusions;
    projecting said patterned beam of radiation onto a substrate;
    releasing said patterning device from said article support with a releasing device; and
    protecting at least a boundary portion of said plurality of supporting protrusions during said release of said patterning device.

17. A device manufacturing method comprising:
    conditioning a beam of radiation;
    patterning the beam of radiation with a patterning device;
    supporting a substrate with an article support, said article support comprising a plurality of supporting protrusions;
    projecting said patterned beam of radiation onto a target portion of said substrate;
    releasing said substrate from said article support with a releasing device; and protecting at least a boundary portion of said plurality of supporting protrusions during said release of said substrate.

18. An article support for supporting a substantially flat article to be placed in a lithographic apparatus, said article support comprising:
   a plurality of supporting protrusions for supporting the article;
   a boundary substantially surrounding said supporting protrusions; and
   at least one protective member located near said boundary for protecting at least a boundary portion of said supporting protrusions during release of said article.

19. An article support according to claim 18, wherein said protective member is formed by the boundary portion of said supporting protrusions, individual supporting protrusions within said boundary portion having a supporting area that is larger than a supporting area of individual supporting protrusions located away from said boundary.

20. An article support according to claim 19, wherein the supporting area of the supporting protrusions gradually decreases as a distance of said protrusions to said boundary increases.

* * * * *